United States Patent
Gablenz et al.

(10) Patent No.: US 8,070,974 B2
(45) Date of Patent: Dec. 6, 2011

(54) SOFT-MAGNETIC MATERIAL AND PROCESS FOR PRODUCING ARTICLES COMPOSED OF THIS SOFT-MAGNETIC MATERIAL

(75) Inventors: Silvio Gablenz, Halle (DE); Marko Kloucek, Niederpöllnitz (DE)

(73) Assignee: Tridelta Weichferrite GmbH, Hermsdorf (DE)

( * ) Notice: Subject to any disclaimer, the term of this patent is extended or adjusted under 35 U.S.C. 154(b) by 130 days.

(21) Appl. No.: 12/479,190

(22) Filed: Jun. 5, 2009

(65) Prior Publication Data

US 2009/0302512 A1 Dec. 10, 2009

(30) Foreign Application Priority Data

Jun. 5, 2008 (DE) .................... 10 2008 026 887
Jun. 5, 2008 (DE) .................... 10 2008 026 888
Sep. 25, 2008 (DE) .................... 10 2008 048 839

(51) Int. Cl.
*H01F 1/20* (2006.01)
*H01F 1/147* (2006.01)

(52) U.S. Cl. ........... 252/62.51 R; 252/62.54; 252/62.56; 252/62.64

(58) Field of Classification Search ........................ None
See application file for complete search history.

(56) References Cited

U.S. PATENT DOCUMENTS

| | | | | | |
|---|---|---|---|---|---|
| 4,097,392 | A | * | 6/1978 | Goldman et al. | 252/62.62 |
| 4,247,500 | A | * | 1/1981 | Dixon et al. | 264/612 |
| 5,198,138 | A | * | 3/1993 | Yamamoto et al. | 252/62.54 |
| 2002/0190236 | A1 | | 12/2002 | Harada | |
| 2006/0278843 | A1 | * | 12/2006 | Someda et al. | 252/62.54 |
| 2007/0102663 | A1 | | 5/2007 | Xiao et al. | |
| 2008/0318045 | A1 | | 12/2008 | Bose et al. | |

FOREIGN PATENT DOCUMENTS

| | | |
|---|---|---|
| DE | 10 2004 041 649 B4 | 12/2006 |
| EP | 1 669 408 A1 | 9/2004 |
| EP | 1 564 767 A2 | 12/2004 |
| EP | 1 790 460 A1 | 11/2006 |
| EP | 1 818 954 A1 | 2/2007 |

* cited by examiner

*Primary Examiner* — Mary F Theisen
(74) *Attorney, Agent, or Firm* — Husch Blackwell LLP (57) ABSTRACT

The invention relates to a soft-magnetic material comprising a micro fraction composed of particles of a soft-magnetic material having a particle size in the range from 1 to 100 μm and a nano fraction composed of particles of a soft-magnetic material having a particle size in the range from 100 to 200 nm, where the proportion of the nano fraction based on the total mass of micro fraction and nano fraction is from 5 to 70% by mass and the particles of the micro fraction and the particles of the nano fraction optionally consist of the same material, and also a process for producing an article composed of the soft-magnetic material.

19 Claims, 7 Drawing Sheets

SOFT-MAGNETIC MATERIAL AND PROCESS FOR PRODUCING ARTICLES COMPOSED OF THIS SOFT-MAGNETIC MATERIAL

FIELD OF THE INVENTION

The invention relates to a soft-magnetic material for producing, for example, shielding materials against electromagnetic waves, housings for electronic and electric instruments and for use in electronic components such as inductance coils and transformers.

BACKGROUND OF THE INVENTION

Materials to shield against electromagnetic fields are becoming increasingly important in industry. Electromagnetic waves can, for instance when used in high-frequency electronic components, lead to interference in nearby components. Furthermore, there is a general desire to reduce electromagnetic radiation.

In recent years, composites, in particular, have been found to be useful for these purposes. Such composites generally comprise a magnetically active material, usually a ferrite, in a polymer matrix. Thus, for example, the German patent application DE 102 22 459 A1 discloses such a composite comprising a modified ferrite powder, electrically conductive nonmetal particles and a magnetic binder in a polymer matrix. A preferred ferrite for this purpose is manganese-zinc ferrite.

Similar materials are now also commercially available and are marketed, for example, by EPCOS AG under the name C350 or C351 ("Ferrites and Accessories"; EPCOS AG; Edition 09/2006), by Vogt (product catalogue "Inductive Component and Modules"; Vogt Elelctronic Components GmbH; Edition 2005) and by Kerafol GmbH (safety data sheet "Keratherm Typ 86/XX"; 6 2000).

However, the known materials have a series of disadvantages. One important aspect is that the density of the known materials is generally below 2.5 g/cm$^3$ because of a very high proportion of polymers. A considerable volume is therefore necessary for effective shielding.

A further disadvantage is that these known materials have to be processed by injection moulding and usually have a very low mechanical strength. Thus, the tensile strengths are generally below 2.5 N/mm$^2$.

Ethylene-vinyl copolymer or polyamide is predominantly used for the polymer matrix in the known composites of this type. This limits the use temperature to regions significantly below 200° C., which leads to the materials not being able to be used for all purposes.

In respect of the magnetic properties, too, the materials were not yet fully satisfactory. Although it was possible to realize initial permeability values $\mu_i$ of from 7 to 20 by means of these materials, it was not possible to achieve values below this range nor to establish a targeted setting of the value in advance. The materials were also unsatisfactory in respect of the achievable saturation magnetization or the coercivity $H_c$.

A further composite and a production process for this are disclosed in the patent application EP 1 564 767 A2. This patent application proposes sieving a magnetic powder material in order to obtain two fractions. The one fraction which remains on the sieve is subsequently coated with an insulating and binding dielectric material. The fine fraction which passes through the sieve is subsequently mixed with the coated magnetic powder again and the mixture is pressed at a temperature below the glass transition temperature. The compressed product is heated and baked with a thermoplastic resin. The magnetic permeability $\mu_i$ attains values of about 350. The citation starts out from particle sizes in the range from 0.1 mm to 0.125 mm.

Finally, the European patent application EP 1 669 408 discloses a composite and a processing or production process for this material. This document states that processing by spray drying is possible for a suitable mixture of water, polymer and the magnetic powder, for example manganese-zinc ferrite. The mixing ratios of magnetic particles to polymer given in the examples lead to a density below 3 g/cm$^3$. The ferrites used had particle sizes in the range from 1.6 to 8.5 μm. In this patent application, a resin having unsaturated vinyl units is used as polymer material. This leads to hard and relatively brittle particles being obtained after spray drying. These can then be used further in unprocessed form as powder, dissolved as paint or by means of casting techniques. However, dry pressing is ruled out because of the brittleness of the particles.

Furthermore, EP 1 790 460 A1 discloses an insulating coating for an electrical component which comprises a thermoset polymer and a filler material in the nano range.

DE 10 2004 041 649 A1 discloses a magnetorheological elastomer whose mechanical properties vary with the applied magnetic field, which comprises magnetizable particles having a bimodal size distribution.

US 2007/0102663 A1 discloses a magnetic paste having multimodal magnetic constituents.

US 2002/0190236 A1 discloses a magnetic granular material which is produced by means of spray drying and contains polymer constituents in addition to a magnetic constituent. The granular material is sintered at 1300° C., with the polymer vaporizing completely. A simple process is disclosed in EP 1 818 954 A1.

SUMMARY OF THE INVENTION

It is an object of the invention to provide a novel material which is improved in terms of both its mechanical properties and its magnetic properties and can be processed easily and reliably.

A further object of the invention is to provide a process for producing articles composed of a soft-magnetic composite, which process is simple to manage and inexpensive and gives articles having improved magnetic and mechanical properties.

These objects are achieved as shown in the independent claims. by a material such as a soft-magnetic material which comprises a micro fraction composed of particles of a soft-magnetic material having a particle size in the range from 1 to 350 μm and a nano fraction composed of particles of a soft-magnetic material having a particle size in the range from 10 to 200 nm. Where the proportion of the nano fraction based on the total mass of micro fraction and nano fraction is from 5 to 70% by mass, such that the material is produced by means of spray drying.

The objects are also achieved by a process for producing an article composed of a soft-magnetic composite, which comprises the steps of provisioning a slip comprising a particulate soft-magnetic material, a particulate polymer binder, a spraying auxiliary and a slip medium. Then spray drying of the slip, dry pressing of the granules obtained by spray drying together with a pressing aid, and partial melting of the polymer binder by heating the pressed article to a temperature above the melting point of the polymer binder. Alternatively these objects are achieved by provisioning of a slip comprising a particulate soft-magnetic material, a spraying auxiliary and a slip medium. Then spray drying of the slip, dry pressing of the granules obtained by spray drying together with a pressing aid, and partial fusion of the soft-magnetic particles by heating the pressed article under a reduced oxygen partial pressure to a temperature at which the soft-magnetic particles are bonded via "sinter necks". The dependent claims relate to further advantageous aspects of the invention.

In addition, the invention provides a soft-magnetic material having a density of 2.9 g/cm$^3$ or more, preferably more than 3.1 g/cm$^3$ and particularly preferably more than 4 g/cm$^3$.

The invention also provides a soft-magnetic material having a tensile strength of more than 3 N/mm$^2$, preferably more than 9 N/mm$^2$ and particularly preferably 14 N/mm$^2$.

Finally, the invention also provides a soft-magnetic material having an initial permeability $\mu_i$ of from 5 to 200, a saturation magnetization of 100 mT or more and a value of the relative loss factor tan d/$\mu_i$ of less than 3000*10$^{-6}$, preferably less than 1700×10$^{-6}$, even better less than 400×10$^{-6}$.

According to a first aspect, the soft-magnetic material comprises a micro fraction composed of particles of a soft-magnetic material having a particle size in the range from 1 to 350 µm and a nano fraction composed of particles of a soft-magnetic material having a particle size in the range from 10 to 200 nm, where the proportion of the nano fraction based on the total mass of micro fraction and nano fraction is from 5 to 70% by mass.

The soft-magnetic material is preferably a ferrite, in particular manganese-zinc ferrite, with the particles of the micro fraction and of the nano fraction optionally consisting of the same material.

The soft-magnetic material is preferably a manganese-zinc ferrite of the formula Mn$_a$Zn$_b$Fe$_{2+c}$O$_{4+d}$, where the indices a, b, c and d are in the following ranges:
0.05<a<0.8;
0.05≦b≦0.6;
0.02≦c≦0.9;
−0.05≦d≦0.05,
where a+b+c=1.

The proportion of the nano fraction based on the total mass of micro fraction and nano fraction is preferably at least 10% by mass, more preferably at least 30% by mass, and also less than 50% by mass, more preferably less than 40% by mass.

The soft-magnetic material preferably has a density of 2.9 g/cm$^3$ or more, preferably more than 3.1 g/cm$^3$ and particularly preferably 4 g/cm$^3$ or more, after the material has been subjected to a spray drying step, a dry pressing step and a heat treatment step or a partial melting step.

The soft-magnetic material preferably has a tensile strength of more than 3 N/mm$^2$, preferably more than 9 N/mm$^2$ and particularly preferably more than 14 N/mm$^2$, after the material has been subjected to a spray drying step, a dry pressing step and a heat treatment step or a partial melting step.

The soft-magnetic material preferably has an initial permeability $\mu_i$ of from 5 to 200, a saturation magnetization of 100 mT or more and the value of tan δ/$\mu_i$ is preferably less than 3000×10$^{-6}$, more preferably less than 1700×10$^{-6}$, even more preferably less than 400×10$^{-6}$, after the composite has been subjected to a spray drying step, a dry pressing step and a heat treatment step or a partial melting step.

The soft-magnetic material preferably comprises a polymer binder, in particular polytetrafluoroethylene (PTFE) or polyether ether ketone (PEEK).

The proportion of binder, based on the total mass of micro fraction and nano fraction, is preferably in the range from 5 to 20% by mass, more preferably from 8 to 12% by mass.

The process of the invention for producing an article composed of a soft-magnetic composite comprises: provision of a slip comprising a particulate soft-magnetic material, a particulate polymer binder, a spraying auxiliary and a slip medium, spray drying of the slip, dry pressing of the granules obtained by spray drying together with a pressing aid, heating of the pressed article to a temperature above the melting point of the polymer binder.

BRIEF DESCRIPTION OF THE DRAWINGS

The invention is illustrated below with the aid of preferred examples and the accompanying figures.

DETAILED DESCRIPTION OF THE ILLUSTRATIVE EMBODIMENT

Figure 1:
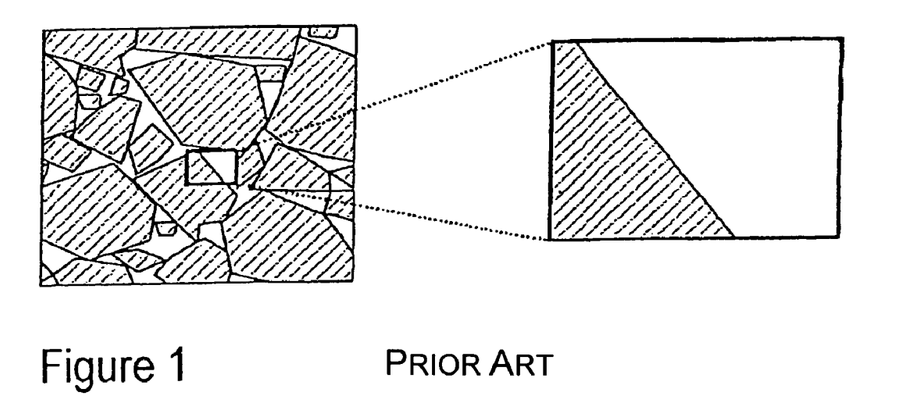
FIG. 1 schematically shows a section through a composite of the prior art.

FIG. 1 shows a known composite. Magnetically active particles, preferably manganese-zinc ferrite particles, are incorporated in a polymer matrix. These particles are obtained in a customary way by milling a larger sintered manganese-zinc ferrite block or core. The diameter of the particles ranges from a few µm to 100 µm.

The material which has been milled and granulated in this way is processed together with the polymer binder by injection moulding and provided as a sheet.

However, owing to the brittleness of the manganese-zinc ferrite crystals, the material has a poor compressibility and large pores remain, which leads to a very low final density. The voids which remain between the individual manganese-zinc ferrite particles and are filled either with air or with the polymer matrix also have an adverse effect on the magnetic particles of the overall material.

Figure 2:
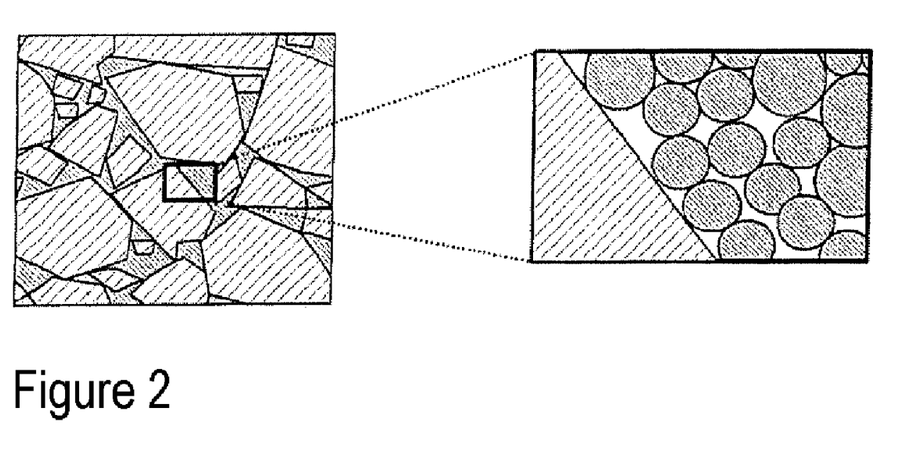
FIG. 2 shows the same view for a soft-magnetic composite according to the invention.

FIG. 2 shows a depiction similar to FIG. 1 based on the soft-magnetic material of the invention. The process for producing this soft-magnetic material is outlined in FIG. 3.

A significant difference between the material of the invention and the prior art is that in addition to the magnetically active particles having a particle size range from 1 to 350 µm, hereinafter referred to as micro fraction, a nano fraction of the same or a similar material is also present. The average particle size of this second nano fraction is in the range from 10 to 200 nm, preferably in the range from 30 to 60 nm, more preferably 50 nm.

Since the particles of the nano fraction are about three orders of magnitude smaller than the particles of the micro fraction, the gaps between microparticles are very densely filled, so that an overall material having a very high density is formed.

The production process will be briefly described below with the aid of FIG. 3.

In a first step, a block or core composed of a magnetically active material, preferably a ferrite, particularly preferably a sintered manganese-zinc ferrite, is provided. The invention is not restricted to soft-magnetic materials. Hard-magnetic ferrites can also be used as starting material, which then leads to a hard-magnetic material.

Manganese-zinc ferrite is a known soft-magnetic material having the general formula $Mn_aZn_bFe_{2+c}O_{4+d}$, where the indices a, b, c and d can be set as desired within the following ranges, $0.05 \leq a \leq 0.8$;
$0.05 \leq b \leq 0.6$;
$0.02 \leq c \leq 0.9$;
$-0.05 \leq d \leq 0.05$,
where a+b+c=1.

In a second step, this core is firstly broken up, for example by means of a jaw crusher, giving particles in the order of magnitude of a few mm, for example 3 mm. These particles are then subjected to a second commminution process, for example dry milling or wet milling, giving particles in the range from a few 10 µm to 400 µm, preferably in the region of 50 µm. Part of these particles is taken off as micro fraction.

Figure 4:
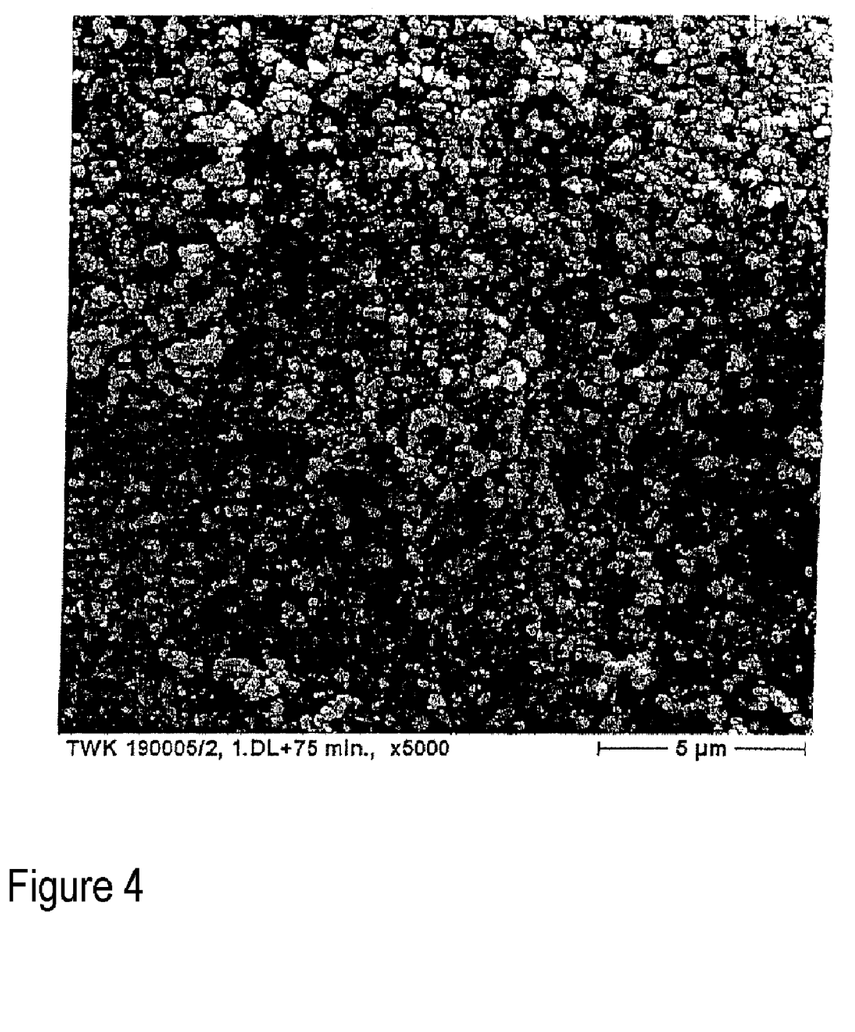
FIGS. 4 and 5 show electron micrographs of parts of the soft-magnetic composite of the invention.
Figure 5:
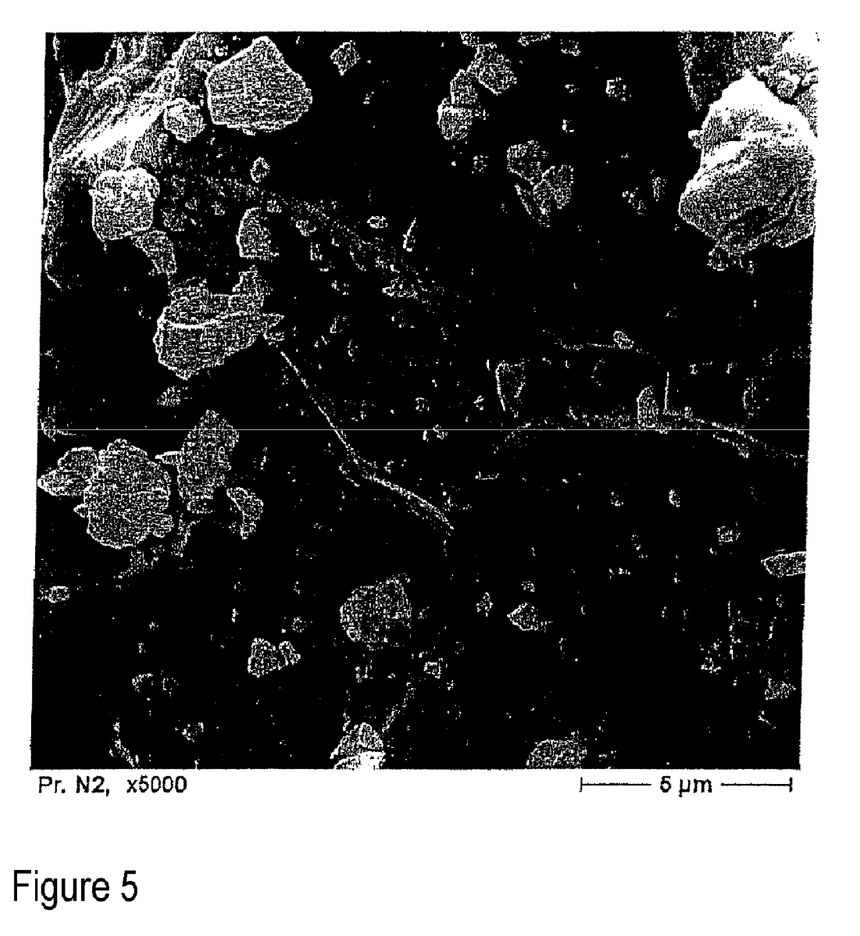
Figure 6:
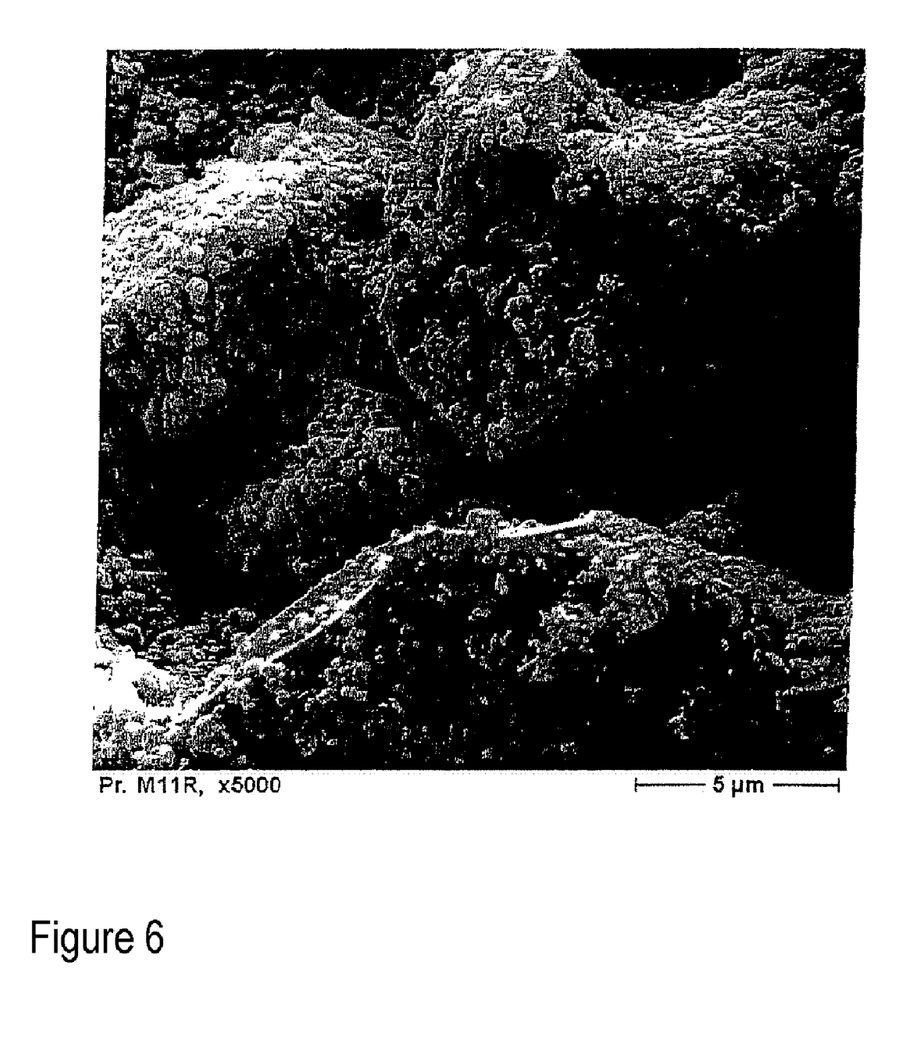
FIG. 6 shows an electron micrograph of the mixture.

The remaining part is subjected to a further comminution process, for example further dry milling, until particles in the order of magnitude of 10 µm are obtained. In two subsequent wet milling steps, the particles are comminuted further until particles in the region of a few 10 nm are finally obtained. Electron micrographs of the micro fraction and the nano fraction are shown in FIGS. 4 and 5. FIG. 6 shows a corresponding micrograph of the mixture.

The particles of the nano fraction can also be obtained by other known technologies, e.g. by precipitation from a suitable solution (for instance oxalate precipitation), by a sol-gel process, by a microemulsion process or by a polyol synthesis.

The two fractions are mixed in a predetermined ratio. Preferred mixing ratios are an approximate proportion of from 5 to 70% by mass of the nano fraction, based on the total mass of micro fraction and nano fraction. Greater preference is given to a mixing ratio of at least 10% by mass, more preferably at least 30% by mass, of the nano fraction based on the total mass of micro fraction and nano fraction. Preference is also given to a mixing ratio of not more than 50% by mass, even more preferably not more than 40% by mass, of the nano fraction based on the total mass of micro fraction and nano fraction.

If the proportion of the nano fraction becomes too small, too many voids remain between the particles of the micro fraction, which leads to a reduction in the overall density and has a disadvantageous effect on the overall properties of the material. An excessively high proportion of the nano fraction, which is less advantageous in terms of its magnetic properties than the micro fraction, likewise has an adverse effect on the properties of the material.

A binder, preferably a polytetrafluoroethylene (PTFE) or a polyether ether ketone (PEEK), can then be added to the mixture of the two particle fractions.

PTFE is a perfluorinated polymer which is sometimes also referred to as Teflon in normal speech. PTFE is a thermoplastic polymer having a density of 2.16 g/cm$^3$ and excellent chemical resistance. The melting point is about 327° C.

PEEK is a thermoplastic polymer which is resistant to high temperatures and has a melting point of about 335° C. and a density in the region of about 1.3 g/cm$^3$.

Other known polymer binders can likewise be used, but the use of PEEK and PTFE is preferred since these have, owing to their thermal stability and good binding properties, a positive effect on the overall properties of the material. Particularly in combination with manganese-zinc ferrite, which has a Curie temperature in the range of about 120-300° C., these polymer binders make it possible for the material to be used virtually in the entire temperature range. The polymer binder is added in a proportion of from 5 to 20%, preferably from 8 to 12% and more preferably 9%, based on the total mass of the micro fraction and of the nano fraction.

A spray auxiliary, for example a polyvinyl alcohol (PVA), is added to the mixture of micro fraction, nano fraction and optionally binder. Finally, a slip medium is added as further component; this is preferably water. The proportion of PVA in the mixture is less than 1%, preferably 0.7%.

This mixture of these components, which is also referred to as a slip, is stirred by means of a blunger so as to avoid demixing and form a suspension of the microparticles, nanoparticles, optionally the polymer binder, the polyvinyl alcohol in water as slip medium. The solids content of this slip is in the range from 30 to 65% by mass, preferably from 40 to 60% by mass and particularly preferably about 55% by mass.

The slip can be subjected to spray granulation or spray drying. Spray granulation or spray drying is a continuous or batch process for drying solutions, suspensions or paste-like compositions.

The material to be dried is introduced by means of a nozzle (operated by liquid pressure or compressed air or inert gas) or rotary atomizer discs (from 4000 to 50 000 revolutions/minute) into a stream of hot air which dries it in fractions of a second to a fine powder. The hot air can flow in cocurrent with the spray medium or in countercurrent to the spray jet.

The spraying device is normally located in an upper part of a spraying tower so that the dry material obtained can be separated off from the stream of air by means of a cyclone separator and taken off. The rapid conversion into the dry state by spray granulation preserves the distribution of the particles. Free-flowing spherical granules are formed.

For further processing to give the workpiece to be produced in the end, this granular material can, if appropriate together with a pressing aid, e.g. a synthetic resin, be subjected to a dry pressing process in which it is compacted.

Figure 3:
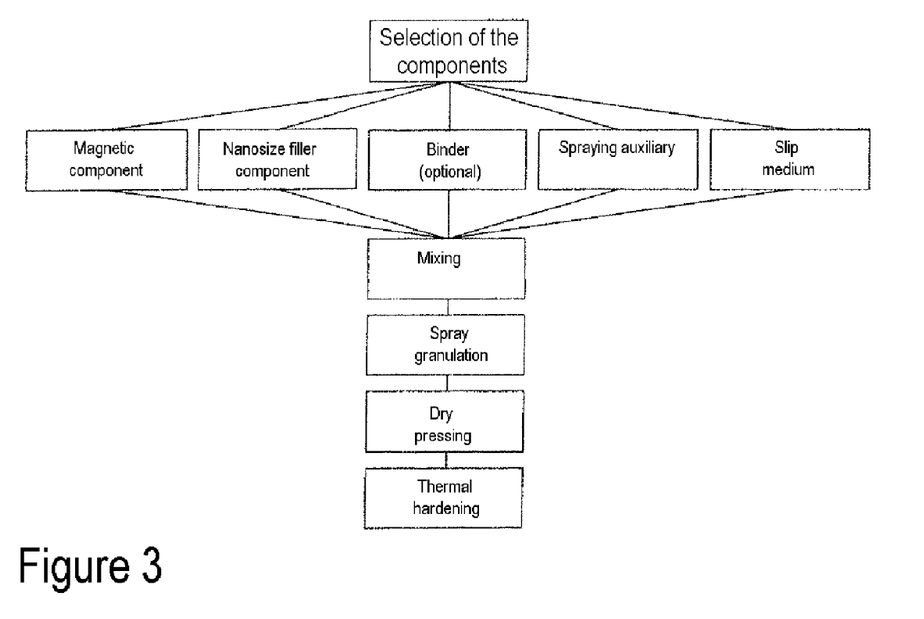
FIG. 3 shows a process flow diagram for the processing and production of the soft-magnetic composite of the invention.
Figure 7:
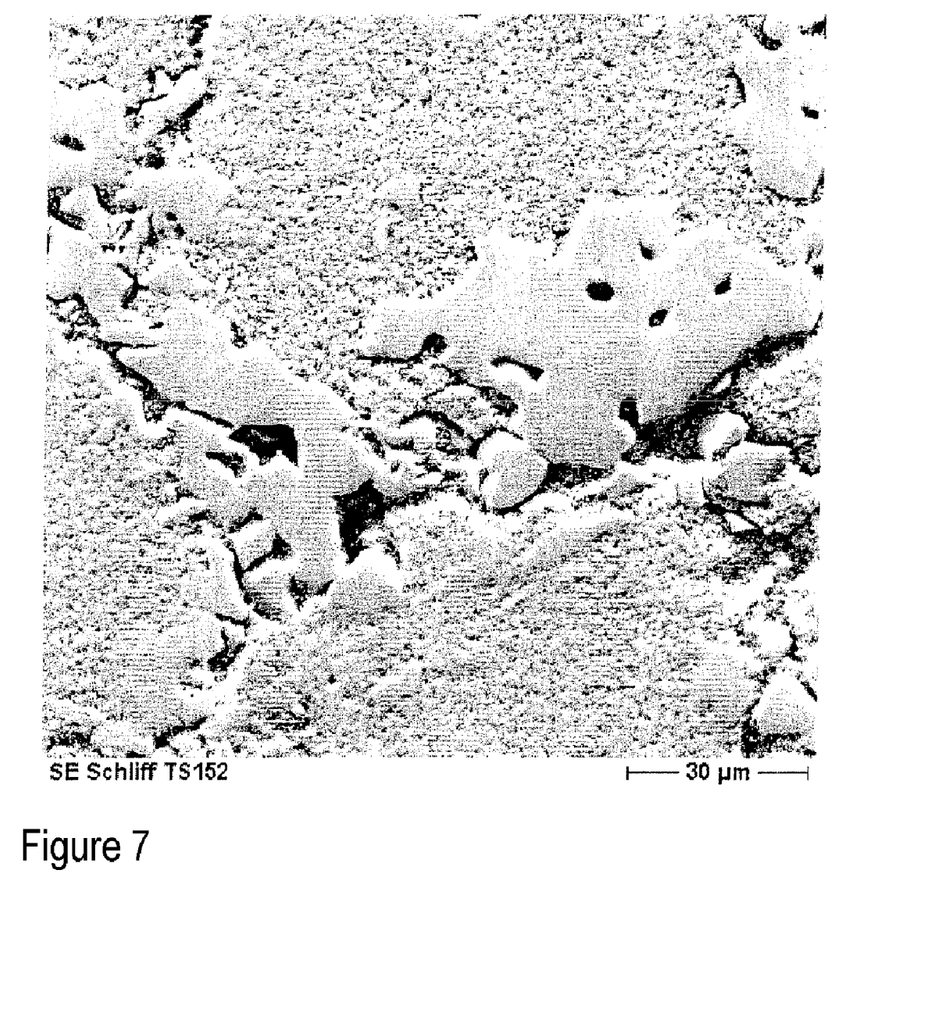
FIG. 7 shows an electron micrograph of a polished section of the material from Example 4 without binder.

In a final step, as shown in FIG. 3, the material is subjected to a heat treatment. For this purpose, the pressed body is quickly and briefly heated, resulting in the stresses arising during pressing being relieved. When using a material which comprises a polymer binder, the material is heated during heat treatment to a temperature above the melting point but below the decomposition or vaporization point of the selected binder, for example to from 360 to 380° C., with conglutination of the ceramic components then occurring as a result of the melting and solidification of the binder. When a material without a binder is used, it is heated during the partial melting to significantly higher temperatures, for example 1020° C., under a reduced oxygen partial pressure, as a result of which the ceramic components are for example bonded via "sinter necks". Here, the temperatures are controlled at values at which the nanosize particles firstly partially form sinter necks between one another and in the periphery to the micro fraction. The grain boundaries of the microparticles are only partially fused, melt together with the nanosize matrix and thus contribute to increasing the density and strength, as shown in FIG. 7.

The soft-magnetic material produced in this way has a series of advantageous properties which distinguish it from the prior art. Furthermore, owing to the controllability of various influencing parameters, it is easy to optimize specific properties within a particular range. For example, it is possible to set the initial permeability $\mu_i$ to virtually any values in the range from 5 to 200. This is achieved, for example, by selection of the magnetic material, for instance the manganese-zinc ferrite, by means of the mixing ratio of the micro fraction and the nano fraction and via the size of the particles of the micro fraction and by the addition or omission of the binder.

The mechanical properties of the material can also vary within a wide range. For example, the tensile strength can be influenced by the choice of the binder, by the pressing pressure during the dry pressing step and by the respective particle sizes of the micro and nano fractions and their mixing ratio. It is possible to achieve considerable tensile strengths which can be significantly above 10 N/mm$^2$, for example 14N/mm$^2$. For comparison, it may be noted that sintered manganese-zinc ferrite has a tensile strength of about 20 N/mm$^2$. Known composites achieve values of from about 2 to 2.5 N/mm$^2$.

The density of the material, which is likewise of critical importance for the magnetic properties, can also be varied within a wide range. The mixing ratio of the micro fraction and of the nano fraction is of great importance here. The material of the invention makes it possible to achieve densities of greater than 4 kg/cm$^3$ for a manganese-zinc ferrite. In comparison, a manganese-zinc ferrite core sintered to high density has a density of 4.9 g/cm$^3$, while known composites achieve values of less than 2.9 g/cm$^3$.

When manganese-zinc ferrite is used as material instead of the still frequently used nickel-zinc ferrite in the field of soft ferrites, there is the additional advantage that the novel material is nontoxic and can therefore be used without health concerns. Disposal also does not pose any environmental problems.

The ability to process the soft-magnetic material of the invention by means of spray granulation, dry pressing and thermal curing, e.g. a heat treatment or "partial melting", makes it possible to achieve rapid, effective and inexpensive production of a variety of articles in a manner which has considerable cost advantages over the injection moulding process which has hitherto mostly been used for composite materials.

The relative loss factor tan d/$\mu_i$ measured at 10 MHz, 0.25 mT and 20° C. is less than 3000×10$^{-6}$, preferably less than 1700×10$^{-6}$, even better less than 400×10$^{-6}$. The coercivity is notably high, with Hc values in the region of 1200 A/m being able to be achieved.

The mixing of micro fraction and nano fraction enables high volume filling factors to be achieved. In the case of embodiments with binder, values of about 80% and more are possible. Classical composites have volume filling factors in the range from 50 to at most 60%. Overall, a soft-magnetic material which has excellent properties, which can additionally be controlled and set to desired values by means of the production process, and can be used in a wide variety of applications is obtained.

Four examples according to the invention are described in detail below.

EXAMPLE 1

The magnetic component is firstly selected. For this example, sintered cores which meet the typical quality requirements for performance ferrites are used as starting materials. The initial permeability $\mu_i$ is in the range from 1800 to 3000, measured at a flux density of B=0.25 mT and a frequency f of 10 kHz. The flux density $B_{250}$ was from 330 to 380 mT, measured at a field strength H=250 A/m and a frequency of f=16 kHz and a temperature of 100° C.

In Example 1, a manganese-zinc ferrite having the formula $Mn_aZn_bFe_{2+c}O_{4+d}$ is used. In the example selected, a=0.71, b=0.18, c=0.11 and d=−0.05.

The cores are crushed by means of a jaw crusher and milled by means of suitable apparatuses. The milled product is subsequently classified, e.g. sieved, in order to obtain the particle fractions of 40 μm and 70 μm for the magnetic component.

The fraction having a size of less than 40 μm which is separated off during classification is subsequently subjected to a two-stage wet milling process in water. In the example according to the invention, steel shot having the following size distributions is used:

1st milling operation: 100%<0.850 mm, 90%<0.710 mm, 15%<0.425 mm, 3%<0.355 mm.

2nd milling operation: 100%<0.425 mm, 90%<0.355 mm, 20%<0.180 mm, 10%<0.125 mm.

The solids content in this wet milling process is set to 40% by mass.

Electron microscopy indicates an average particle size after wet milling in the range from 50 to 100 nm. The particle size determined from the BET surface area was 42 nm.

In Example 1, pulverulent polyether ether ketone (PEEK) is used as binder material.

In the example, the pulverulent PEEK has a size distribution of 100%<50 μm; 50%<18 μm and 10%<4 μm.

A spraying auxiliary in the form of a polyvinyl alcohol (PVA) is added to the mixture of micro fraction, nano fraction and PEEK. This polyvinyl alcohol is dissolved in water by means of steam, so that a 12% strength by mass aqueous PVA suspension without a segregation effect is formed.

All components were brought into suspension in water by rapid stirring. The suspension contained about 63.2% by mass of the magnetic component of the micro fraction, 27.1% by mass of the nano fraction, 9% by mass of PEEK and 0.7% by mass of PVA (based on the dry mass of PVA) in an adequate amount of water. The total solids content was 56.5% by mass.

The suspension or slip formed in this way is passed to spray granulation.

In the example according to the invention, a spraying pressure of 12 bar is set and the nozzle diameter was 0.9 mm. The size of the rotating body was 1 mm and the temperature was set to 140-160° C.

The spray-dried material produced in this way had a bulk density of 1.24 g/cm. The runout time was 47 seconds. The residual moisture content was 0.1% by mass.

The spray-dried material was subjected to a sieve analysis, giving the following size distribution: 0%>315 μm; 1%>250 μm; 23%>200 μm; 72%>125 μm, 95%>71 μm; 98%>45 μm. 2% was dust.

The spray-dried material obtained in this way is highly suitable for dry pressing. For this purpose, the spray-dried material was rolled with 0.5% by mass of water and 1% by mass of oxide resin and uniaxially pressed at 350 MPa to form an annular core.

In a last step, the core obtained in this way was heat treated, i.e. it was heated at 100 kelvin/minute to 380° C., held at that temperature for 4 minutes and cooled again at a rate of 100 kelvin/minute, with the entire thermal process being carried out at an oxygen partial pressure of $p_{o2}$=20% (air).

The dimensions of the annular core were 29 mm external diameter, 21 mm internal diameter and 8 mm height. Five windings were wound around the annular core in order to measure the initial permeability $\mu_i$ and further magnetic parameters such as tan d/$\mu_i$. The measurements were carried out at 10 MHz, a flux density B=0.25 mT and 20° C. The value of the initial permeability $\mu_i$ was 22. The value for tan d/$\mu_i$ was less than 3000×10$^{-6}$.

The material produced in this way also had excellent mechanical properties. The tensile strength was 9 N/mm$^2$. The density of the material was above 2.9 g/cm$^3$.

EXAMPLE 2

The second example corresponded in terms of the production method and composition to the first example, except that the pressing pressure during dry pressing was 700 MPa.

A value for the initial permeability $\mu_i$ of 25 was found in Example 2. The value for tan d/$\mu_i$ was less than 1700×10$^{-6}$.

The increased pressing pressure resulted in an increase in the tensile strength to 14 N/mm$^2$ and an increase in the density to 3.1 g/cm$^3$.

EXAMPLE 3

Example 3 differs from Example 2 in that a polytetrafluoroethylene (PTFE) was used instead of the PEEK polymer.

To produce the suspension, a size distribution of 100%<40 μm; 50%<5 μm and 10%<0.7 μm was employed.

The pressing pressure was once again set to 700 MPa.

In Example 3, the heat treatment process was slightly modified, with the heating rate being 10 kelvin/minute and a final temperature of 360° C. being reached. The core was maintained at this temperature for 10 minutes and then cooled again at a rate of 10 kelvin/minute.

The annular core produced in this way had an initial permeability $\mu_i$ of 33 and the value of tan d/$\mu_i$ was less than 3000×10$^{-6}$. A density of 4.1 g/cm$^3$ and a tensile strength of 9 N/mm$^2$ can be achieved using this polymer.

EXAMPLE 4

Example 4 differs from Example 2 in that no polymer binder is used in the mixture of the components and, in addition, the step of thermal hardening is carried out under altered conditions.

In this embodiment, the thermal hardening is carried out by heating the core obtained at 5 K/minute at an oxygen partial pressure $p_{o2}$=0.001% by volume to 1020° C., then maintaining it at this temperature for 2 hours at $p_{o2}$ 0.2% by volume and cooling it again at a rate of 5 K/minute. During cooling, the oxygen partial pressure is gradually decreased to a value of $p_{o2=0.0001}$% by volume which is reached at 700° C. and is kept constant until complete cooling to room temperature has occurred. The value pairs of temperature T and oxygen partial pressure $p_{o2}$ during the cooling phase have the following logarithmic relationship: lg ($p_{o2}$)=6.7−(12 240/T[K]).

FIG. 7 shows an electron micrograph of a polished section of this material. Here, sinter necks between the particles of the nano fraction and the particles of the micro fraction which are formed during thermal hardening can be seen. The annular core produced in this way had an initial permeability $\mu_i$ of 120 and the value of tan d/$\mu_i$ was less than 400×10$^{-6}$. A density of 4.0 g/cm$^3$ and a tensile strength of 14 N/mm$^2$ were achieved. Table 1 summarizes the results of Examples 1, 2, 3 and 4 once more.

TABLE 1

| Example | Pressing pressure [MPa] | Tensile strength [N/mm$^2$] | Density [g/cm$^3$] | $\mu_i$ | Tan d/$\mu_i$ [×10$^{-6}$] |
|---|---|---|---|---|---|
| 1 | 350 | 9 | 2.9 | 22 | <3000 |
| 2 | 700 | 14 | 3.1 | 25 | <1700 |
| 3 | 700 | 9 | 4.1 | 33 | <3000 |
| 4 | 700 | 14 | 4.0 | 120 | <400 |

The initial permeability $\mu_i$ can be set, for example, via the ratio of micro fraction to nano fraction. The nano fraction should make up from 5% by mass to 70% by mass of the total mass of the micro fraction and the nano fraction. The size distribution of the micro fraction also has an appreciable influence on the value of the initial permeability $\mu_i$. Smaller diameters of the micro fraction tend to allow smaller values of the initial permeability $\mu_i$ to be set.

The invention thus makes it possible to set values of the initial permeability $\mu_i$ in the range from 5 to 200.

The mechanical tensile strength can be influenced not only by the selection of the pressing pressure in the dry pressing step but also by the choice of the polymer binder and the ratio of micro fraction to nano fraction.

In the case of all materials produced according to the invention, the parameter tan d/$\mu_i$ which characterizes the magnetic losses was significantly below 3000×10$^{-6}$, sometimes significantly below 1500×10$^{-6}$ and even below 400×10$^{-6}$. The measurements were carried out at 20° C. and 10 MHz.

The significant advantages of the soft-magnetic material of the invention include the fact that it does not, in contrast to other known composites containing soft-magnetic ferrite particles, have to be processed in a complicated and expensive injection moulding process but can be processed in the significantly cheaper and simpler spray drying process with subsequent dry pressing. This considerably reduces the production costs.

The invention is not restricted to the use of manganese-zinc ferrite as magnetic component. Other ferrites such as nickel-zinc ferrite can also be used.

Furthermore, the invention is not restricted to using only one micro fraction and one nano fraction. Advantageously, it is also possible to select two discrete micro fractions, for example one having a particle diameter in the range from 60 to 70 μm and a second in a particle size range from 30 to 40 μm. This applies analogously to the nano fraction.

However, according to the invention, a very effective soft-magnetic material is obtained by the combination of at least one micro fraction and a nano fraction.

With regard to the polymer material used for the optional binder, too, the invention is not restricted to PTFE and PEEK. Other polymers such as ethylene-vinyl copolymers or polyamides can also be used. However, these materials have only limited suitability for spray drying and the hardening process described, which is why PEEK and PTFE are preferred.

While the micro fraction and the nano fraction were identical in respect of the chemical composition in the examples presented, this is not an absolute requirement. The magnetic and mechanical properties can also be influenced by using different materials for the micro fraction and the nano fraction.

What we claim is:

1. Soft-magnetic material which comprises:
   a micro fraction composed of particles of a soft-magnetic material having a particle size in the range from 1 to 350 μm;
   a nano fraction composed of particles of a soft-magnetic material having a particle size in the range from 10 to 200 nm;
   where the proportion of the nano fraction based on the total mass of micro fraction and nano fraction is from 5 to 70% by mass;
   wherein the material is produced by means of spray drying.

2. Soft-magnetic material according to claim 1, wherein the soft-magnetic material is a ferrite and the particles of the micro fraction and of the nano fraction optionally consist of the same material.

3. Soft-magnetic material according to claim 1, wherein the soft-magnetic material is a manganese-zinc ferrite, and the particles of the micro fraction and of the nano fraction optionally consist of the same material.

4. Soft-magnetic material according to claim 3, wherein the manganese-zinc ferrite corresponds to the formula $Mn_aZn_bFe_{2+c}O_{4+d}$, where the indices a, b, c and d are in the following ranges:

0.05<a<0.8;
0.05<b<0.6;
0.02<c<0.9;
−0.05<d<0.05,
where a+b+c=1.

5. Soft-magnetic material according to claim 1, wherein the proportion of the nano fraction based on the total mass of micro fraction and nano fraction is at least 10% by mass and also less than 50% by mass.

6. Soft-magnetic material according to claim 1, wherein the density is 2.9 g/cm$^3$ or more, after the material has been subjected to a spray drying step, a dry pressing step and a heat treatment step or a partial melting step.

7. Soft-magnetic material according to claim 1, wherein the tensile strength is more than 3 N/mm$^2$, after the material has been subjected to a spray drying step, a dry pressing step and a heat treatment step or a partial melting step.

8. Soft-magnetic material according to claim 1, wherein the initial permeability $\mu_i$ is from 5 to 200, the saturation magnetization is 100 mT or more and the value of tan $\delta/\mu_i$ is less than 3000×10$^{-6}$, after the composite has been subjected to a spray drying step, a dry pressing step and a heat treatment step or partial melting step.

9. Soft-magnetic material according to claim 1, wherein the material further comprises a polymer binder.

10. Soft-magnetic material according to claim 9, wherein the polymer binder is polytetrafluoroethylene (PTFE) or a polyether ether ketone (PEEK).

11. Soft-magnetic material according to claim 10, wherein the proportion of binder, based on the total mass of micro fraction and nano fraction, is in the range from 5 to 20% by mass.

12. Soft-magnetic material according to claim 1, wherein the proportion of the nano fraction based on the total mass of micro fraction and nano fraction is at least 30% by mass and also less than 40% by mass.

13. Soft-magnetic material according to claim 1, wherein the density is more than 3.1 g/cm$^3$, after the material has been subjected to a spray drying step, a dry pressing step and a heat treatment step or a partial melting step.

14. Soft-magnetic material according to claim 1, wherein the density is 4 g/cm$^3$ or more, after the material has been subjected to a spray drying step, a dry pressing step and a heat treatment step or a partial melting step.

15. Soft-magnetic material according to claim 1, wherein the tensile strength is more than 9 N/mm$^2$, after the material has been subjected to a spray drying step, a dry pressing step and a heat treatment step or a partial melting step.

16. Soft-magnetic material according to claim 1, wherein the tensile strength is more than 14 N/mm$^2$, after the material has been subjected to a spray drying step, a dry pressing step and a heat treatment step or a partial melting step.

17. Soft-magnetic material according to claim 1, wherein the initial permeability $\mu_i$ is from 5 to 200, the saturation magnetization is 100 mT or more and the value of tan $\delta/\mu_i$ is less than 1700×10$^{-6}$, after the composite has been subjected to a spray drying step, a dry pressing step and a heat treatment step or partial melting step.

18. Soft-magnetic material according to claim 1, wherein the initial permeability $\mu_i$ is from 5 to 200, the saturation magnetization is 100 mT or more and the value of tan $\delta/\mu_i$ is less than 400×10$^{-6}$, after the composite has been subjected to a spray drying step, a dry pressing step and a heat treatment step or partial melting step.

19. Soft-magnetic material according to claim 10, wherein the proportion of binder, based on the total mass of micro fraction and nano fraction, is in the range from 8 to 12% by mass.

* * * * *